United States Patent
Lomeli et al.

(10) Patent No.: US 12,340,846 B2
(45) Date of Patent: Jun. 24, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Nancy M. Lomeli, Boise, ID (US); Rajasekhar Venigalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 527 days.

(21) Appl. No.: 17/537,990

(22) Filed: Nov. 30, 2021

(65) Prior Publication Data
US 2023/0170024 A1 Jun. 1, 2023

(51) Int. Cl.
*H10B 41/10* (2023.01)
*G11C 16/04* (2006.01)
(Continued)

(52) U.S. Cl.
CPC ........ *G11C 16/0483* (2013.01); *H01L 23/481* (2013.01); *H10B 41/10* (2023.02);
(Continued)

(58) Field of Classification Search
CPC ........ H10B 41/10; H10B 41/27; H10B 41/35; H10B 43/10; H10B 43/27; H10B 43/35;
(Continued)

(56) References Cited

U.S. PATENT DOCUMENTS

| 12,176,034 B2 | 12/2024 | Scarbrough et al. |
| 2015/0179704 A1 | 6/2015 | Yoshida et al. |

(Continued)

FOREIGN PATENT DOCUMENTS

| CN | 113629058 | 11/2021 |
| WO | PCT/US2022/045166 | 1/2023 |

OTHER PUBLICATIONS

U.S. Appl. No. 17/582,280, filed Jan. 24, 22, by Fazil et al.

*Primary Examiner* — Moazzam Hossain
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAVs that individually extend through the insulative tiers and the conductive tiers into the conductor tier. Individual of the TAVs comprise an upper portion directly above and joined with a lower portion. The individual TAVs comprise at least one external jog surface in a vertical cross-section where the upper and lower portions join. The lower portion is wider in the vertical cross-section than the upper portion where the upper and lower portions join. Other embodiments, including method, are disclosed.

18 Claims, 7 Drawing Sheets

(51) Int. Cl.
*H01L 23/48* (2006.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............. *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ... H10B 43/50; G11C 16/0483; H01L 23/481; H01L 27/14612; H10F 39/8037
See application file for complete search history.

(56) References Cited

U.S. PATENT DOCUMENTS

| | | |
|---|---|---|
| 2016/0351581 A1 | 12/2016 | Ahn |
| 2017/0179026 A1 | 6/2017 | Toyama et al. |
| 2020/0295026 A1* | 9/2020 | Oike .................. H01L 21/76831 |
| 2021/0217761 A1 | 7/2021 | Tiwari |
| 2021/0288067 A1 | 9/2021 | Kanamori et al. |
| 2021/0313343 A1* | 10/2021 | Jung .................... H10B 63/845 |
| 2021/0313427 A1 | 10/2021 | Kim et al. |
| 2021/0351128 A1 | 11/2021 | Kim et al. |
| 2021/0358943 A1* | 11/2021 | Lee ........................ H10B 41/27 |
| 2021/0375911 A1 | 12/2021 | Greenlee et al. |
| 2022/0336421 A1 | 10/2022 | Kim et al. |

* cited by examiner

FIG. 13 ions are views of memory arrays comprising
MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture.

Figure 1:
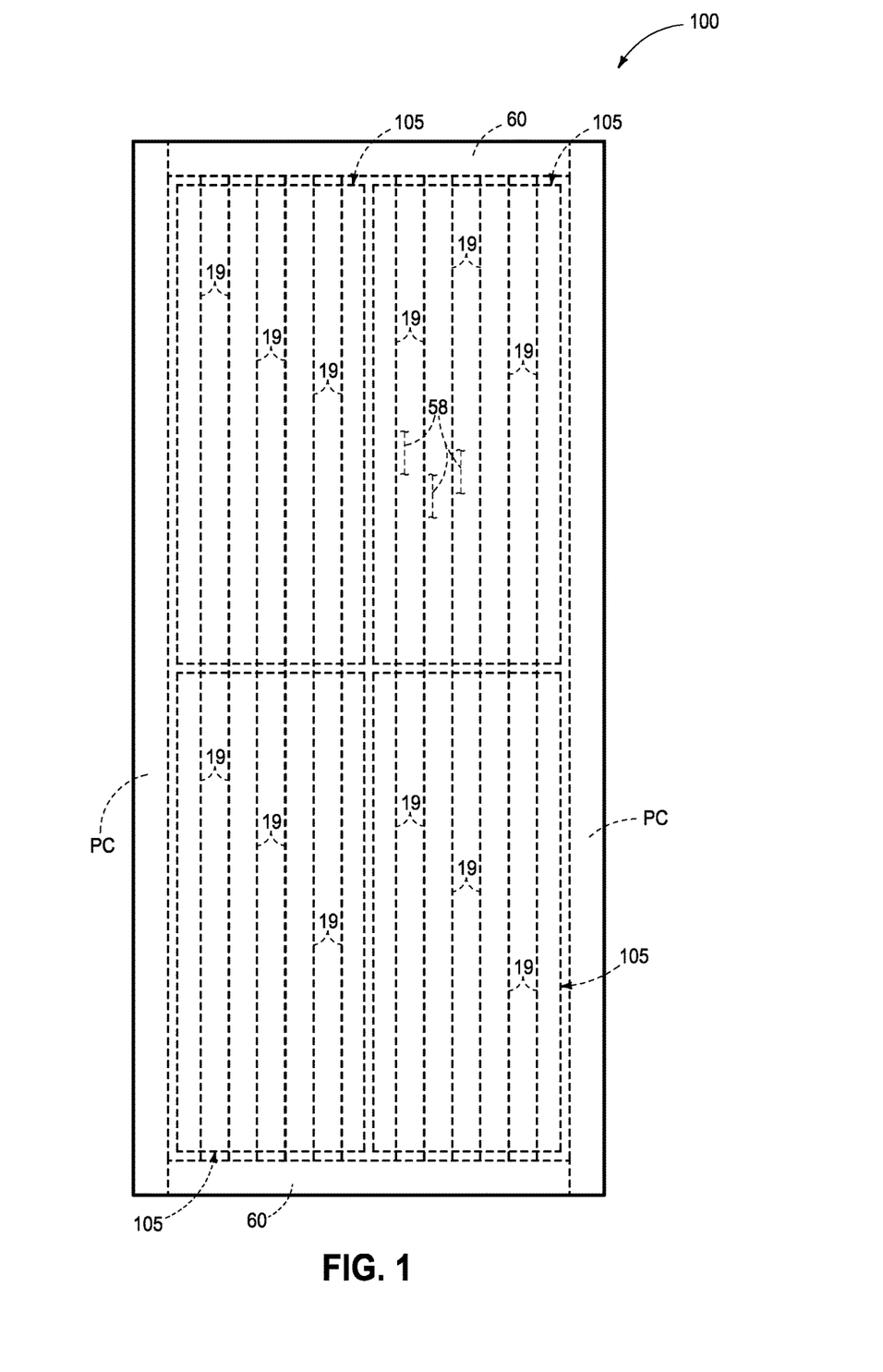
FIGS. 1-13 are views of memory arrays comprising strings of memory cells in accordance with embodiments of the invention.
Figure 2:
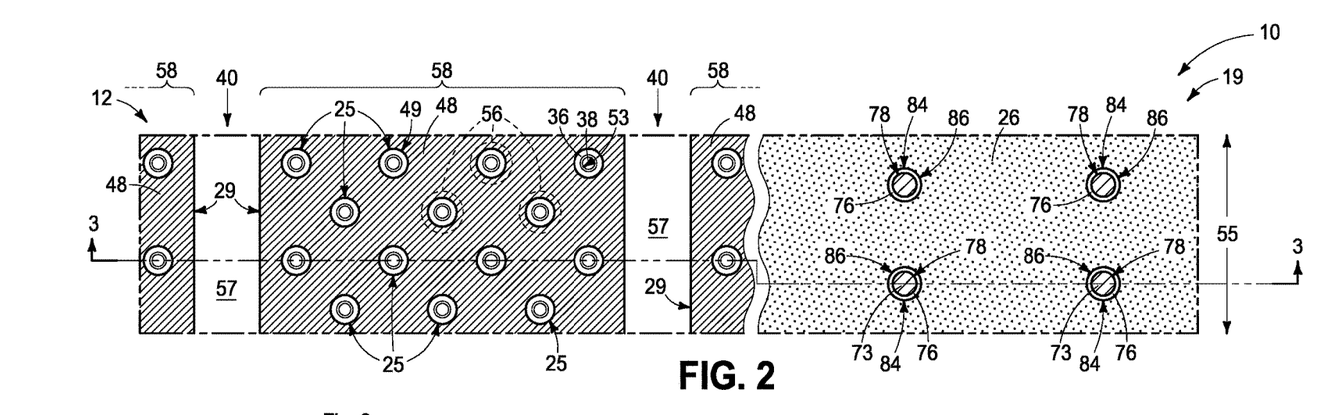
Figure 3:
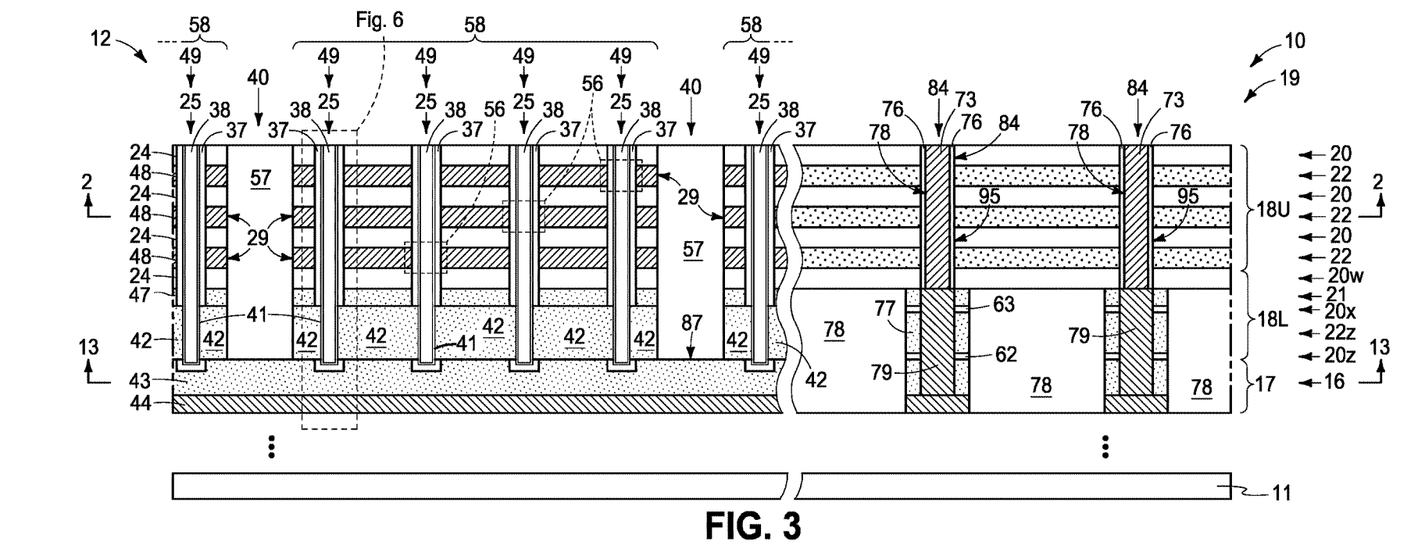
Figure 4:
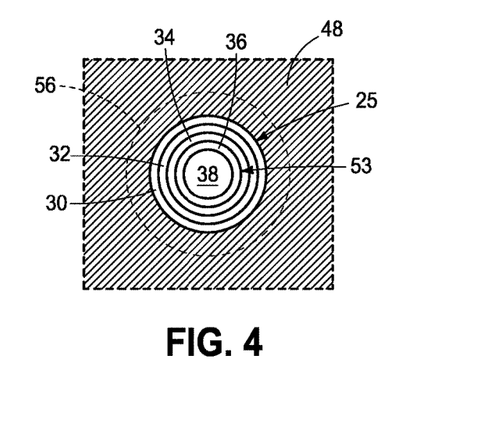
Figure 5:
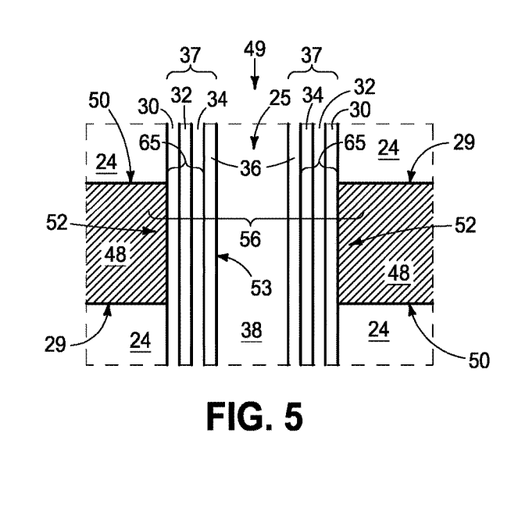
Figure 6:
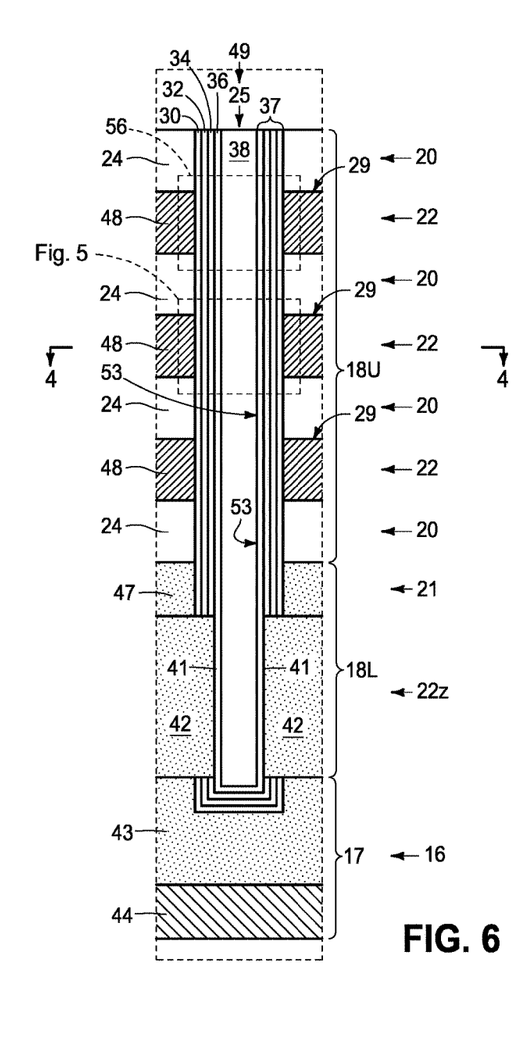
Figure 7:
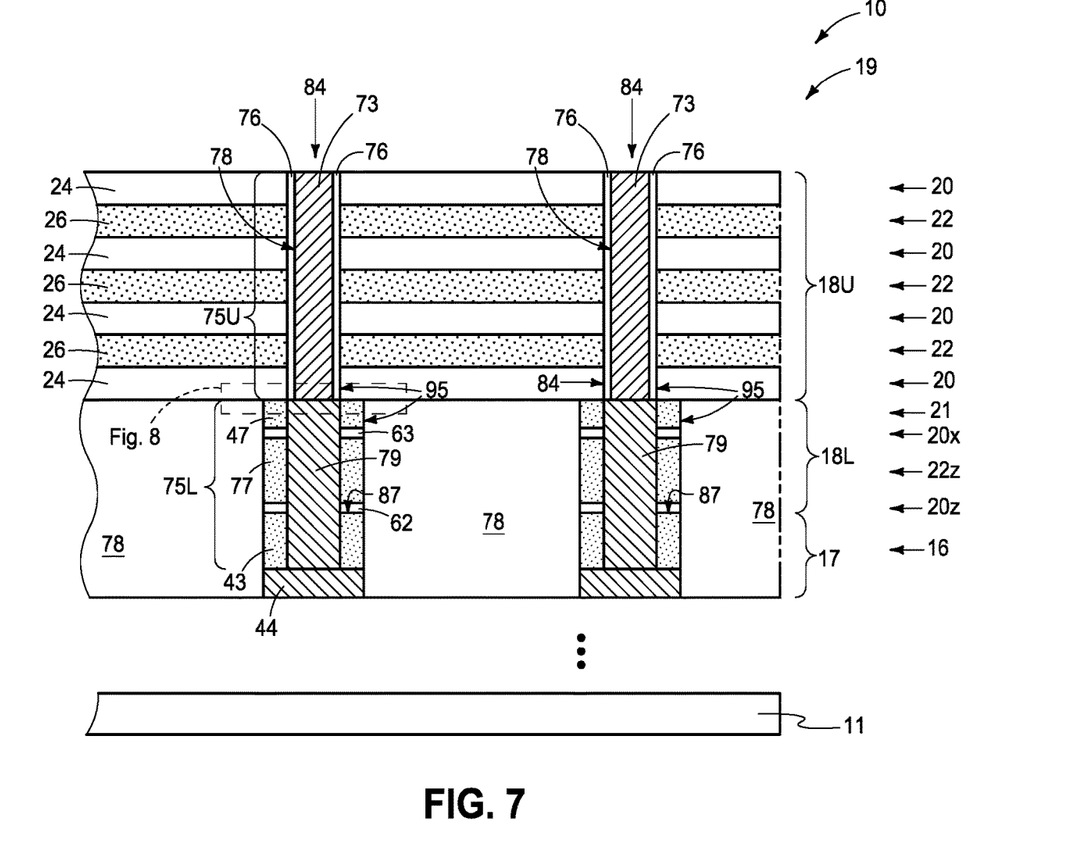
Figure 8:
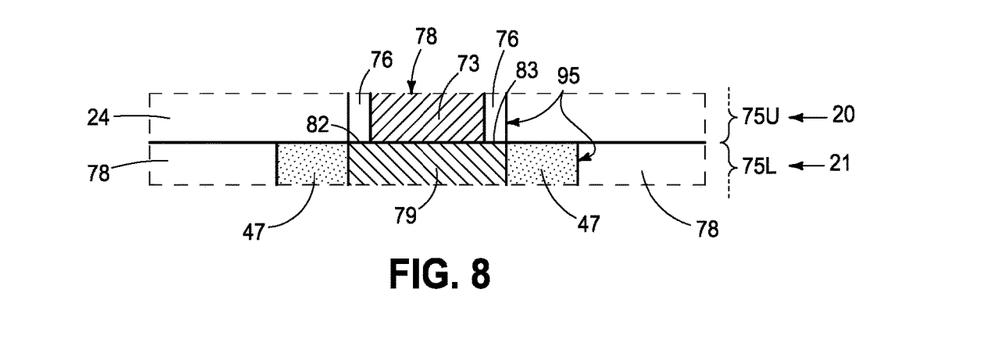

First example embodiments are described with reference to FIGS. 1-8 and 13. FIG. 1 diagrammatically shows an example embodiment construction 10 comprising a die or die area 100 comprising a memory array 12. Die or die area 100 may be part of a larger substrate (e.g., a semiconductor wafer, and not shown). Alternately, and by way of examples only, die or die area 100 may be part of an integrated circuit chip or part of a package containing an integrated circuit chip. Example die 100 comprises at least one memory-plane region 105 (four being shown), laterally-spaced memory blocks 58 in individual memory-plane regions 105, through-array-via (TAV) regions 19, a stair-step region 60 (two being shown at opposing longitudinal ends of side-by-side pairs of the memory planes), and a peripheral circuitry region PC (two being shown). In this document, "block" is generic to include "sub-block". Alternate orientations may be used, for example having a stair-step region between immediately-adjacent memory planes (not shown). FIGS. 2-8 and 13 are diagrammatic larger and varied scale views of portions of die or die area 100.

Memory array 12 comprises elevationally-extending strings 49 of memory cells 56 that are shown by way of example only as being above a base substrate 11 that comprises one or more of conductive/conductor/conducting, semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 2-8, 13-depicted materials. For example, other partially or wholly fabricated components of integrated circuitry may be provided somewhere above, about, or in base substrate 11. Control and/or other peripheral circuitry for operating components in array 12 of elevationally-extending strings of memory cells may also be fabricated and may or may not be wholly or partially in an array or sub-array. Further, multiple sub-arrays may also be fabricated and operated independently, in tandem, or otherwise relative one another. In this document, a "sub-array" may also be considered as an array.

A "TAV region" (e.g., region 19) is a region in which operative TAVs are present or will be formed. An "operative TAV" is a circuit-operative conductive interconnect extending through a stack 18* (described below; an * being used as a suffix to be inclusive of all such same-numerically-designated components that may or may not have other suffixes) and between electronic components at different elevations in a finished construction of integrated circuitry that has been or is being fabricated. A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be in a memory-block region (not shown).

An example conductor tier 16 (e.g., having a top 87) comprising conductor material 17 is above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to memory cells 56 in array 12.

An example vertical stack 18* is directly above conductor tier 16 in individual laterally-spaced memory blocks 58 and may comprise a lower portion 18L and an upper portion 18U above substrate 11 and conductor tier 16. Stack 18* comprises vertically-alternating conductive tiers 22* (alternately referred to as first tiers) and insulative tiers 20* (alternately referred to as second tiers), with material of tiers 22* being of different composition from material of tiers 20*. Example thickness for each of tiers 20* and 22* is 22 to 60 nanometers. Only a small number of tiers 20* and 22* is shown, with more likely stack 18* comprising dozens, a hundred or more, etc. of tiers 20* and 22*. Other circuitry that may or may not be part of peripheral and/or control circuitry may be between conductor tier 16 and stack 18*. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22 may be a select gate tier. Example insulative tiers 20* comprise insulative material 24 (e.g., silicon dioxide and/or silicon nitride).

Example conductive tiers 22* comprise conducting material 48, for example that forms individual conductive lines 29 (e.g., wordlines). A thin insulative liner (e.g., $Al_2O_3$ and not shown) may surround conducting material 48. Example memory-cell strings 49 comprising memory cells 56 are in channel openings 25 and extend to conductor tier 16. Channel openings 25 may taper radially-inward (and material therein and not shown) moving deeper into stack 18. Memory-cell strings 49 may go partially into conductor material 17 of conductor tier 16 as shown.

Memory blocks 58 may be longitudinally elongated and oriented, for example along a direction 55. Such are shown as being separated or spaced by intervening material 57 that is in horizontally-elongated trenches 40. Trenches 40 may taper laterally-inward or laterally-outward moving deeper into stack 18* (not shown). Intervening material 57 may provide lateral electrical isolation (insulation) between immediately-laterally-adjacent memory blocks 58. Intervening material 57 may include one or more of insulative, semiconductive, and conducting materials and, regardless, may facilitate laterally-adjacent conductive tiers 22* from shorting relative one another. Example insulative materials are one or more of $SiO_2$, $Si_3N_4$, $Al_2O_3$, and undoped polysilicon. As further examples, intervening material 57 may comprise a laterally-outermost insulative material (e.g., silicon dioxide and not shown) and a laterally-inner material (e.g., undoped polysilicon and not shown) of different composition from that of the laterally-outermost insulative material. Additionally, and/or alternately, intervening material 57 may comprise one or more TAVs (not shown). One or more trenches 40 may be formed directly against TAV region 19 (not shown) including, for example, at least partially therewithin (not shown). Alternately, a trench 40 that is closest to TAV region 19 may be laterally spaced therefrom (as shown).

In some embodiments, lower portion 18L in TAV region 19 comprises a lowest tier 20z of second tiers 20* directly above (e.g., directly against) conductor material 17 (e.g., in TAV region 19). Example lowest second tier 20z is insulative (e.g., comprising material 62, for example silicon dioxide and/or silicon nitride). A lowest tier 22z of first tiers 22* is directly above lowest second tier 20z in TAV region 19 (e.g., comprising conductively-doped polysilicon 42 in array region 12 and doped or undoped polysilicon 77 in TAV region 19). A next-lowest second tier 20x of second tiers 20* is directly above lowest second tier 20z and lowest first tier 22z (e.g., in TAV region 19; e.g., comprising material 63, for example silicon dioxide and/or silicon nitride). A conducting-material tier 21 comprising conducting material 47 (e.g., conductively-doped polysilicon) is directly above next-lowest second tier 20x (e.g., in TAV region 19). Additional tiers may be present. Example second tiers 20x and 20z may have been sacrificial in array region 12 during fabrication and are accordingly not there-shown. For example, material in lowest conductive tier 22z in array region 12 may be sacrificial and removed before removing materials 62 and/or 63 from tiers 20x and/or 20z, respectively, followed by formation of conductive material 42 in array region 12. Accordingly, and regardless, and in one embodiment as shown, tier 21 and tier 22z being directly against one another may collectively be considered as the lowest conductive tier in array region 12. Example upper portion 18U is shown starting above lower portion 18L with a first tier 22 although such could alternately start with a second tier 20 (not shown). Further, and by way of example, lower portion 18L may be formed to have one or more first and/or second tiers as a top thereof.

Transistor channel material is in the individual channel openings elevationally along the insulative tiers and the conductive tiers, and comprises at least part of individual operative memory-cell pillars which are directly electrically coupled with conductive material in the conductor tier. Individual memory cells of the memory array may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Channel material 36 as a channel-material string 53 is in channel openings 25 elevationally along insulative tiers 20 and conductive tiers 22, with channel-material strings 53 directly electrically coupling with conductor material 17 of conductor tier 16. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may have been conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (e.g., material 42). Regardless, sacrificial etch-stop plugs (not shown) may have been formed in lower portion 18L in horizontal locations where channel openings 25 will be prior to forming upper portion 18U. Channel openings 25 may then be formed by etching materials of stack 18* to stop on or in the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown). In one embodiment and as shown, the channel-material strings are directly electrically coupled with the conductor material of the conductor tier by conductive material (e.g., 42) that is in the lowest conductive tier (e.g., 21/22z) and that is directly against sidewalls (e.g., 41) of multiple of the channel-material strings.

By way of example and for brevity only, channel openings 25 (and material therein) are shown as being arranged in groups or columns of staggered rows of three and four channel openings 25 per row. Trenches 40 will typically be wider than channel openings 25 (e.g., 3 to 10 times wider). Any alternate existing or future-developed arrangement and construction may be used.

Approximate locations of transistors and/or memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

TAV region 19 comprises TAV constructions 95 that individually extend through insulative tiers 20* and conductive tiers 22* into conductor tier 16. Individual TAV constructions 95 comprises an upper portion 75U directly above and joined with a lower portion 75L. TAV constructions 95 comprise a radially-outer insulative lining 76 and a conductive core 78 (e.g., comprising conductive material 73; e.g., a TiN lining having W radially-inward thereof) radially-inward of insulative lining 76. Lower portion 75L comprises conducting material 79 (e.g., a TiN lining having W radially-inward thereof) that is wider in a vertical cross-section (e.g., that of FIGS. 3, 7, and 8) than conductive material 73 of conductive core 78 in upper portion 75U to comprise at least one external jog surface (e.g., two external jog surfaces 82, 83 being shown) in the vertical cross-section where the upper portion 75U joins with lower portion 75L. In this document, a "jog surface" is characterized or defined by an abrupt change in direction [at least 15°] in comparison to surfaces that are immediately-above and immediately-below the jog surface. In one embodiment, insulative lining 76 is directly against the external jog surface (e.g., one or both of jog surfaces 82, 83) of conducting material 79. In one embodiment, the external jog surface (e.g., one or both of jog surfaces 82, 83) is above top 87 of conductor tier 16. In one embodiment, no portion of insulative lining 76 is aside conducting material 79 of lower portion 75L in individual TAV constructions 95 and, in one embodiment, no portion of insulative lining 76 is in conductor tier 16. In one embodiment, the external jog surface includes a part that is horizontal and in one such embodiment the part being exactly horizontal (e.g., the part(s) being all of the jog surfaces and being exactly horizontal in the example embodiment).

Any other attribute(s) or aspect(s) as shown and/or described herein with respect to other embodiments may be used.

Figure 9:
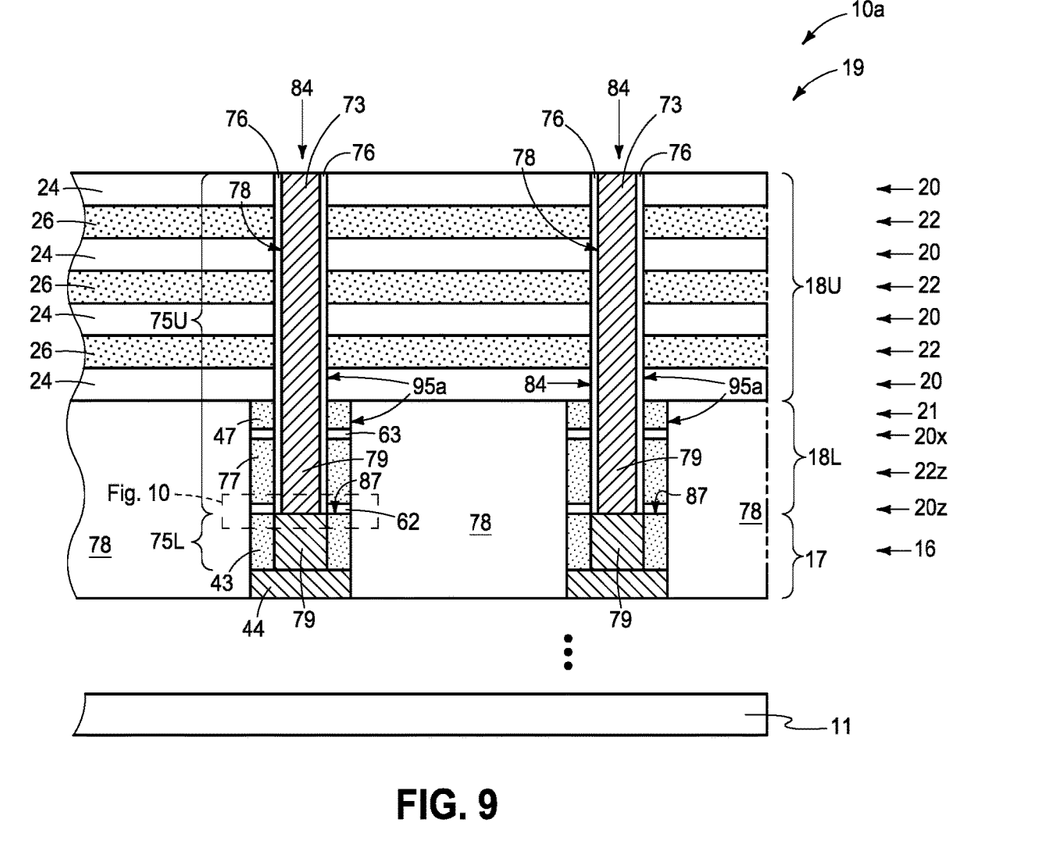
Figure 10:
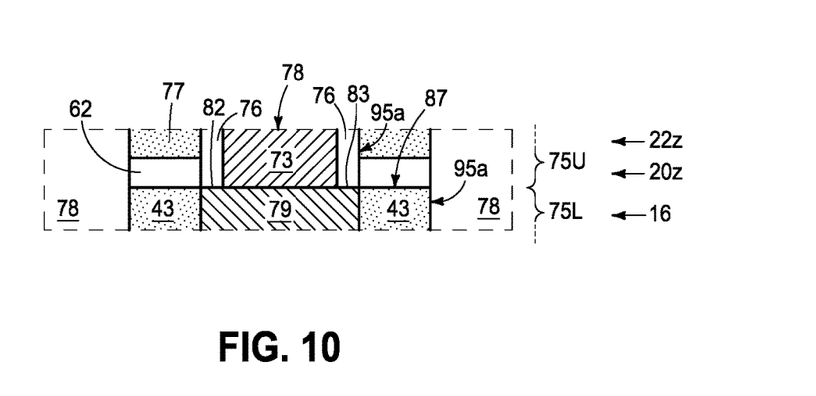

The example embodiments shown by FIGS. 2-8 and 13 have their tops above top 87 of conductor tier 16 and have their bottoms in conductor tier 16 (e.g., such bottoms being in conductor material 17 at a top of conductor material 44). However, such tops and/or bottoms could be up or down from that shown by FIGS. 2-8 and 13. For example, FIGS. 9 and 10 show a construction 10a comprising TAV constructions 95a comprising TAVs (e.g., materials 73 and 79). Like numerals from the above-described embodiments have been used where appropriate, with some construction differences being indicated with the suffix "a" or with different numerals. The external jog surface (e.g., one or both of jog surfaces 82, 83) in TAV construction 10a is at a top 87 of conductor tier 16. Any other attribute(s) or aspect(s) as shown and/or described herein with respect to other embodiments may be used.

Figure 11:
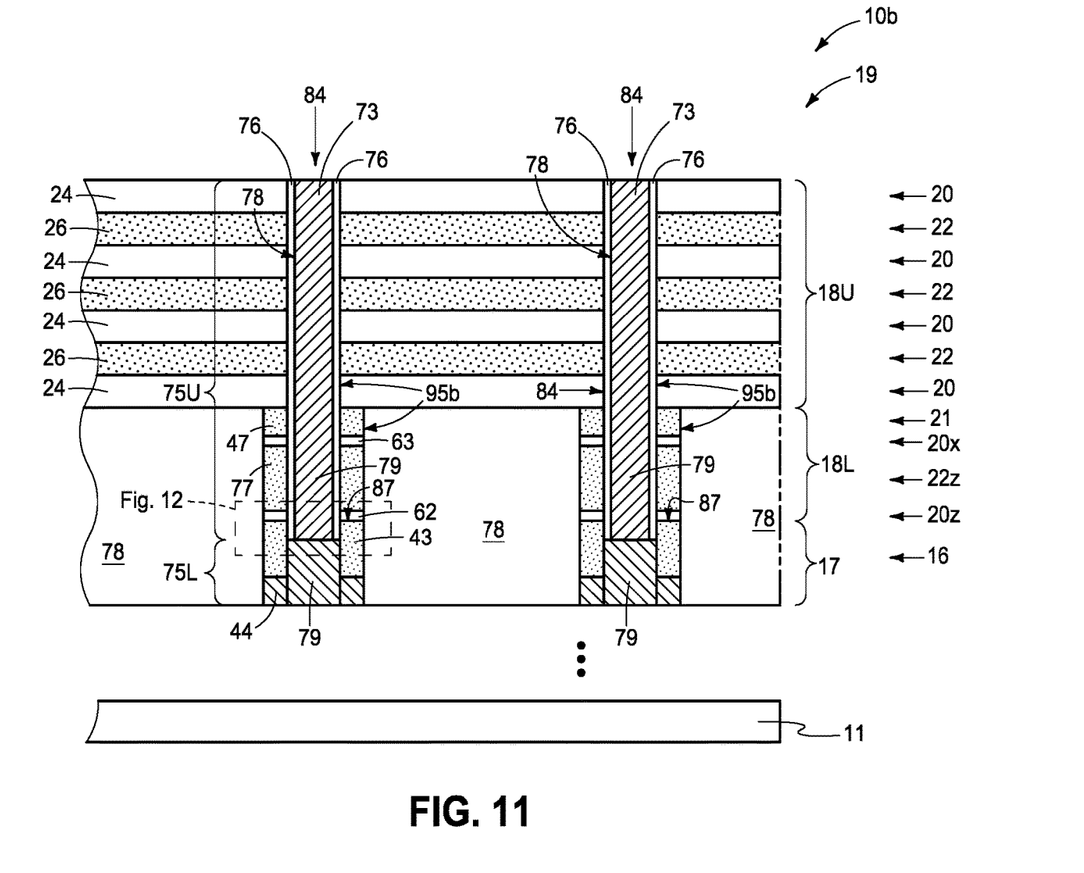
Figure 12:
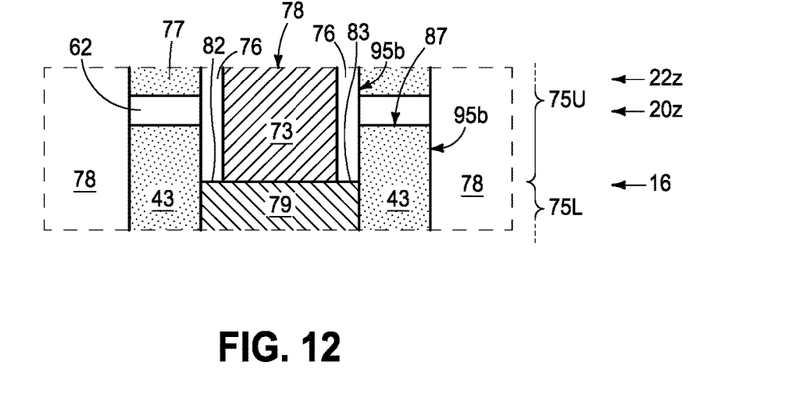
Figure 13:
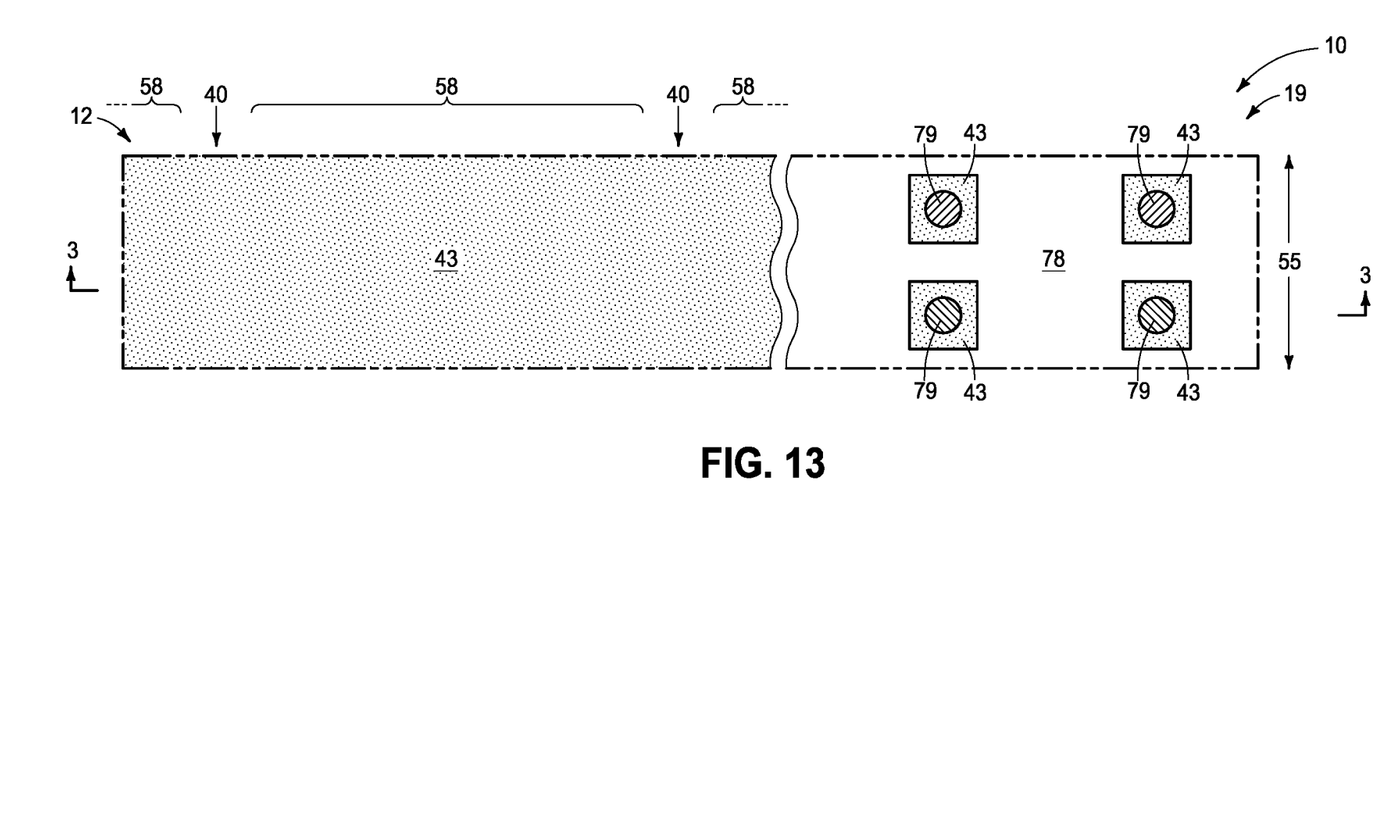

FIGS. 11 and 12 show another example construction 10b comprising TAV constructions 95b comprising TAVs (e.g., materials 73 and 79). Like numerals from the above-described embodiments have been used where appropriate, with some construction differences being indicated with the suffix "b" or with different numerals. The external jog surface (e.g., one or both of jog surfaces 82, 83) in TAV construction 10b is below and in conductor tier 16. In one embodiment, insulative lining 76 extends downwardly into conductor tier 16. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). The strings of memory cells comprise channel-material strings (e.g., 53) that extend through the insulative tiers and the conductive tiers. The channel-material strings directly electrically couple with conductor material (e.g., 17) of the conductor tier. A TAV region (e.g., 19) is included and comprises TAVs (e.g., materials 73 and 79) that individually extend through the insulative tiers and the conductive tiers into the conductor tier. Individual of the TAVs comprise an upper portion (e.g., 75U) directly above and joined with a lower portion (e.g., 75L). The individual TAVs comprise at least one external jog surface in a vertical cross-section where the upper and lower portions join (e.g., 82 and/or 83, and regardless of presence of an insulative lining 76). The lower portion is wider in the vertical cross-section than the upper portion where the upper and lower portions join. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). The strings of memory cells comprise channel-material strings (e.g., 53) that extend through the insulative tiers and the conductive tiers. The channel-material strings directly electrically couple with conductor material (e.g., 17) of the conductor tier. A TAV region (e.g., 19) is included and comprises TAV constructions (e.g., 95*) that individually extend through the insulative tiers and the conductive tiers into the conductor tier. Individual of the TAV constructions comprise an upper portion (e.g., 75U) directly above and joined with a lower portion (e.g., 75L). The individual TAV constructions comprise a radially-outer insulative lining (e.g., 76) and a conductive core (e.g., 78) radially-inward of the insulative lining. The insulative lining is directly against a conducting top surface (e.g., 82 and/or 83, and regardless of whether such constitute(s) a jog surface) of the lower portion. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). The strings of memory cells comprise channel-material strings (e.g., 53) that extend through the insulative tiers and the conductive tiers. The channel-material strings directly electrically couple with conductor material (e.g., 17) of the conductor tier. A TAV region (e.g., 19) is included and comprises TAV constructions (e.g., 95*) that individually extend through the insulative tiers and the conductive tiers into the conductor tier. Individual of the TAV constructions comprise an upper portion (e.g., 75U) directly above and joined with a lower portion (e.g., 75L). The individual TAV constructions comprise a radially-outer insulative lining (e.g., 76) and a conductive core (e.g., 78) radially-inward of the insulative lining. No portion of the insulative lining is aside conducting material (e.g., 79) of the lower portion in the individual TAV constructions. Any other attribute(s) or aspect(s) as shown and/or described herein with respect to other embodiments may be used.

Embodiments of the invention encompass methods used in forming a memory array. Such embodiments encompass so-called "gate-first" processing and other processing whether existing or future-developed independent of when transistor gates are formed. Memory arrays formed in accordance with method embodiments may incorporate, form, and/or have any of the attributes described with respect to device embodiments.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). A lower portion (e.g., 18L) of a stack (e.g., 18*) is formed and that will comprise vertically-alternating first tiers (e.g., 22*) and second tiers (e.g., 20*) directly above the conductor tier. The stack comprises laterally-spaced memory-block regions (e.g., 58) and a TAV region (e.g., 19).

Lower portions (e.g., 75L) of TAVs (e.g., materials 73 and 79) are formed in the lower portion of the stack in the TAV region. The vertically-alternating first tiers (e.g., 22*) and second tiers (e.g., 20*) of an upper portion (e.g., 18U) of the stack are formed directly above the lower portion of the stack and directly above the lower portions of the TAVs. Channel-material strings (e.g., 53) are formed and extend through the first tiers and the second tiers in the upper portion of the stack to the lower portion of the stack in the memory-block regions. TAV openings (e.g., 84) are formed into the upper portion of the stack and that individually extend to individual of the lower portions of the TAVs. Upper portions (e.g., 75U) of individual of the TAVs are formed in individual of the TAV openings directly against the lower portions of the individual TAVs. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAVs that individually extend through the insulative tiers and the conductive tiers into the conductor tier. Individual of the TAVs comprise an upper portion directly above and joined with a lower portion. The individual TAVs comprise at least one external jog surface in a vertical cross-section where the upper and lower portions join. The lower portion is wider in the vertical cross-section than the upper portion where the upper and lower portions join.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAV constructions that individually extend through the insulative tiers and the conductive tiers into the conductor tier. Individual of the TAV constructions comprise an upper portion directly above and joined with a lower portion. The individual TAV constructions comprise a radially-outer insulative lining and a conductive core radially-inward of the insulative lining. The insulative lining is directly against a conducting top surface of the lower portion.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAV constructions that individually extend through the insulative tiers and the conductive tiers into the conductor tier. Individual of the TAV constructions comprise an upper portion directly above and joined with a lower portion. The individual TAV constructions comprise a radially-outer insulative lining and a conductive core radially-inward of the insulative lining. No portion of the insulative lining is aside conducting material of the lower portion in the individual TAV constructions.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAV constructions that individually extend through the insulative tiers and the conductive tiers into the conductor tier. Individual of the TAV constructions comprise an upper portion directly above and joined with a lower portion. A radially-outer insulative lining and a conductive core are radially-inward of the insulative lining in the upper portion. Conducting material of the lower portion is wider in a vertical cross-section than conductive material of the conductive core in the upper portion to comprise at least one external jog surface in the vertical cross-section where the upper and lower portions join. The insulative lining is directly against the external jog surface of the conducting material.

In some embodiments, a method used in forming a memory array comprising strings of memory cells comprises forming a conductor tier comprising conductor material on a substrate. A lower portion of a stack is formed that will comprise vertically-alternating first tiers and second tiers directly above the conductor tier. The stack comprises laterally-spaced memory-block regions and a through-array-via (TAV) region. Lower portions of TAVs are formed in the lower portion of the stack in the TAV region. The vertically-alternating first tiers and second tiers of an upper portion of the stack are formed directly above the lower portion of the stack and directly above the lower portions of the TAVs. Channel-material strings are formed that extend through the first tiers and the second tiers in the upper portion of the stack to the lower portion of the stack in the memory-block regions. TAV openings are formed into the upper portion of the stack that individually extend to individual of the lower portions of the TAVs. Upper portions of individual of the TAVs in individual of the TAV openings are formed directly against the lower portions of the individual TAVs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling with conductor material of the conductor tier; and
    a through-array-via (TAV) region comprising TAVs that individually extend through the insulative tiers and the conductive tiers into the conductor tier, individual of the TAVs comprising an upper portion directly above and joined with a lower portion, the individual TAVs comprising at least one external jog surface in a vertical cross-section where the upper and lower portions join, the lower portion being wider in the vertical cross-section than the upper portion where the upper and lower portions join, the external jog surface being one of (a) or (b), where:
        (a): at a top of the conductor tier; and
        (b): below a top of the conductor tier.

2. The memory array of claim 1 wherein the external jog surface is the (a).

3. The memory array of claim 1 wherein the external jog surface is the (b).

4. The memory array of claim 1 wherein the external jog surface includes a part that is horizontal in the vertical cross-section.

5. The memory array of claim 1 comprising two external jog surfaces in the vertical cross-section in the individual TAVs.

6. The memory array of claim 5 wherein the two external jog surfaces individually include a part that is horizontal in the vertical cross-section.

7. The memory array of claim 1 wherein the upper and lower jog surfaces individually include a part that is horizontal.

8. The memory array of claim 7 wherein the part is exactly horizontal.

9. The memory array of claim 1 wherein the channel-material strings are directly electrically coupled with the conductor material of the conductor tier by conductive material that is in a lowest of the conductive tiers and that is directly against sidewalls of multiple of the channel-material strings.

10. The memory array of claim 1 comprising NAND.

11. The memory array of claim 1 wherein the channel-material strings are directly electrically coupled with the conductor material of the conductor tier by conductive material that is in a lowest of the conductive tiers and that is directly against sidewalls of multiple of the channel-material strings.

12. A memory array comprising strings of memory cells, comprising:
    laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling with conductor material of the conductor tier; and
    a through-array-via (TAV) region comprising TAV constructions that individually extend through the insulative tiers and the conductive tiers into the conductor tier, individual of the TAV constructions comprising an upper portion directly above and joined with a lower portion, the individual TAV constructions comprising a radially-outer insulative lining and a conductive core radially-inward of the insulative lining, the insulative lining being directly against a conducting top surface of the lower portion, undoped polysilicon being directly against the conductive core in the lower portion.

13. The memory array of claim 12 wherein no portion of the insulative lining that is directly against the conducting top surface of the lower portion is aside conducting material of the lower portion in the individual TAV constructions.

14. The memory array of claim 12 wherein no portion of the insulative lining that is directly against the conducting top surface of the lower portion is in the conductor tier.

15. The memory array of claim 12 wherein,
    no portion of the insulative lining that is directly against the conducting top surface of the lower portion is aside conducting material of the lower portion in the individual TAV constructions; and
    no portion of the insulative lining that is directly against the conducting top surface of the lower portion is in the conductor tier.

16. The memory array of claim 12 wherein the insulative lining that is directly against the conducting top surface of the lower portion extends downwardly into the conductor tier.

17. The memory array of claim 16 wherein no portion of the insulative lining that is directly against the conducting top surface of the lower portion is aside conducting material of the lower portion in the individual TAV constructions.

18. The memory array of claim 12 wherein conducting material of the lower portion of the individual TAV constructions is wider in a vertical cross-section than conductive material of the conductive core in the upper portion where the upper and lower portions join.

* * * * *